(12) United States Patent
Smulders et al.

(10) Patent No.: US 7,684,010 B2
(45) Date of Patent: Mar. 23, 2010

(54) LITHOGRAPHIC APPARATUS, DEVICE MANUFACTURING METHOD, SEAL STRUCTURE, METHOD OF REMOVING AN OBJECT AND A METHOD OF SEALING

(75) Inventors: Patrick Johannes Cornelus Hendrick Smulders, Best (NL); Peter Smits, Baarlo (NL)

(73) Assignee: ASML Netherlands B.V., Veldhoven (NL)

( * ) Notice: Subject to any disclaimer, the term of this patent is extended or adjusted under 35 U.S.C. 154(b) by 130 days.

(21) Appl. No.: 11/075,819

(22) Filed: Mar. 9, 2005

(65) Prior Publication Data

US 2006/0203215 A1    Sep. 14, 2006

(51) Int. Cl.
G03B 27/42 (2006.01)
G03B 27/52 (2006.01)

(52) U.S. Cl. .................................... 355/53; 355/30
(58) Field of Classification Search ............ 355/30, 355/53; 428/317.3, 343; 156/230
See application file for complete search history.

(56) References Cited

U.S. PATENT DOCUMENTS

| | | | |
|---|---|---|---|
| 3,573,975 A | 4/1971 | Dhaka et al | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 4,574,697 A * | 3/1986 | Feeley | 101/401.1 |
| 5,040,020 A | 8/1991 | Rauschenbach et al. | 355/53 |
| 5,121,256 A | 6/1992 | Corle et al. | 359/664 |
| 5,354,614 A * | 10/1994 | Cox et al. | 428/343 |
| 5,476,712 A * | 12/1995 | Hartman et al. | 428/317.3 |
| 5,582,884 A * | 12/1996 | Ball et al. | 428/341 |
| 5,610,683 A | 3/1997 | Takahashi | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 6,975,387 B2 * | 12/2005 | Mizuno | 356/121 |
| 7,256,868 B2 * | 8/2007 | Akamatsu | 355/53 |
| 7,379,162 B2 * | 5/2008 | Miyajima | 355/72 |
| 2002/0020821 A1 | 2/2002 | Van Santen et al. | 250/492 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Hung Henry Nguyen
(74) *Attorney, Agent, or Firm*—Pillsbury Winthrop Shaw Pittman LLP

(57) ABSTRACT

A lithographic apparatus for immersion lithography is disclosed in which a seal between different parts of a substrate table is arranged to be easily applied and removed and in an embodiment, reduces transmission of forces between the different parts.

21 Claims, 4 Drawing Sheets

U.S. PATENT DOCUMENTS

| | | | |
|---|---|---|---|
| 2002/0163629 A1 | 11/2002 | Switkes et al. | 355/53 |
| 2003/0089552 A1* | 5/2003 | Sahawneh | 182/1 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/63 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0231694 A1* | 10/2005 | Kolesnychenko et al. | 355/53 |
| 2005/0233081 A1 | 10/2005 | Tokita | 427/256 |
| 2007/0076182 A1* | 4/2007 | Hazelton et al. | 355/53 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-214552 A | 7/2004 |
| JP | 2006-165572 A | 6/2006 |
| JP | 2006-210502 A | 8/2006 |
| JP | 2006-245402 A | 9/2006 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microlab., Microsyst.* 1(1):7-12 (2002).

Nothce of Reasons for Rejection for Japanese Patent Application No. 2006-062036 dated May 19, 2009.

* cited by examiner

1

LITHOGRAPHIC APPARATUS, DEVICE MANUFACTURING METHOD, SEAL STRUCTURE, METHOD OF REMOVING AN OBJECT AND A METHOD OF SEALING

FIELD

The present invention relates to a lithographic apparatus and a method for manufacturing a device and a seal structure and methods involving the seal structure.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Handling and/or providing a liquid in an immersion lithography apparatus may create difficulties. For example, delicate parts of the substrate table should be liquid proof to avoid ingress of liquid.

SUMMARY

Accordingly, it would be advantageous, for example, to seal between different parts of the substrate table and optionally to have a seal which does not transmit a force between the parts of the substrate table between which the seal extends.

According to an aspect of the invention, there is provided a lithographic apparatus, comprising:

a substrate table constructed to hold a substrate and having a sensor; and a flexible seal structure positioned between the sensor and the substrate table, the flexible seal structure being adhered at one end to the sensor and at another end to the substrate table.

According to an aspect of the invention, there is provided a device manufacturing method comprising projecting a beam of radiation onto a sensor, wherein a flexible seal structure is positioned between the sensor and a substrate table configured to hold a substrate, the flexible seal structure being adhered at one end to the sensor and at another end to the substrate table.

According to an aspect of the invention, there is provided a disposable seal structure configured to seal a periphery of a sensor to a substrate table in a lithographic projection apparatus, the seal structure being flexible, having an adhesive layer applied to one side, and being liquid proof.

According to an aspect of the invention, there is provided a combination of a sensor and a disposable seal structure configured to seal a periphery of the sensor to a substrate table in a lithographic projection apparatus, the seal structure being flexible, having an adhesive layer applied to one side, and being liquid proof.

According to an aspect of the invention, there is provided a method of removing an object from a substrate table in a lithographic projection apparatus, the object being sealed to the substrate table through a seal structure adhered at one end to the substrate table and at another end to the object, the method comprising:

breaking the seal structure at a position between the two ends; and removing the object.

According to an aspect of the invention, there is provided a method of sealing between an object of a substrate table and the substrate table, comprising:

adhering a disposable seal structure configured to seal a periphery of the object to the substrate table, the seal structure being flexible, having an adhesive layer applied to one side and being liquid proof, at one end to the object and at another end to the substrate table with the adhesive layer.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
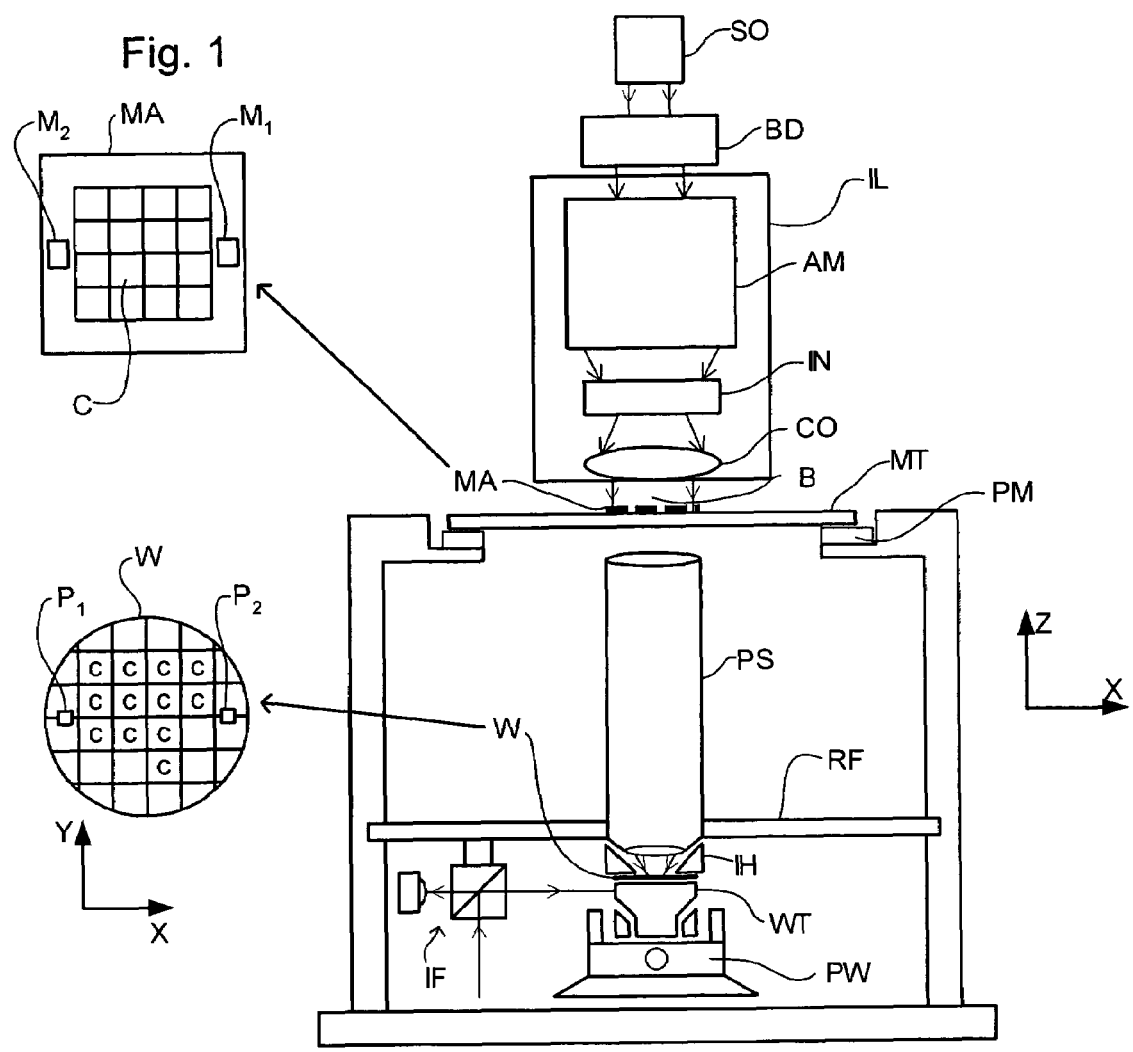
FIG. 1 depicts a lithographic apparatus according to an embodiment of the invention.
Figure 2:
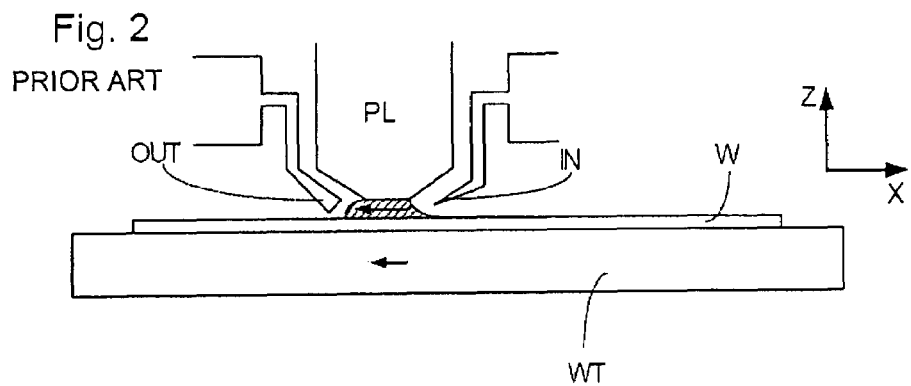
FIGS. 2 and 3 depict a liquid supply system for use in a lithographic projection apparatus.
Figure 3:
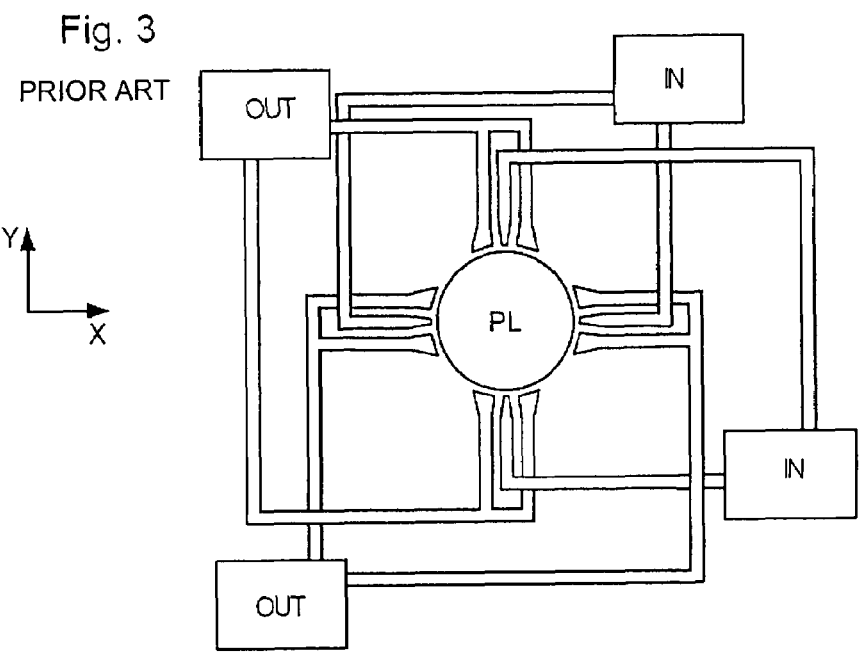

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
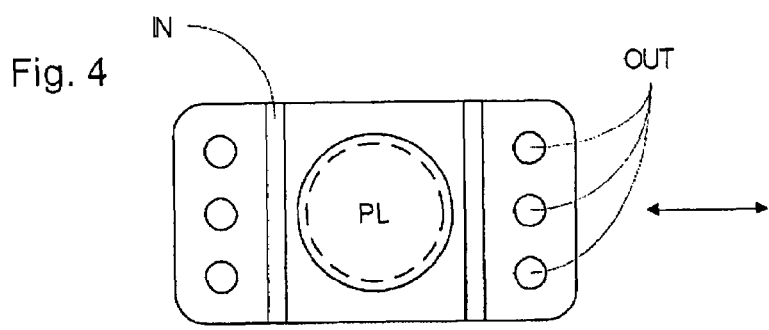
FIG. 4 depicts another liquid supply system for use in a lithographic projection apparatus.
Figure 4:
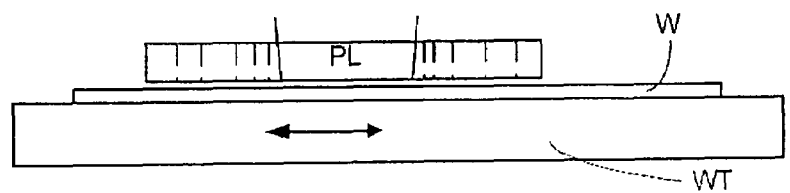

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
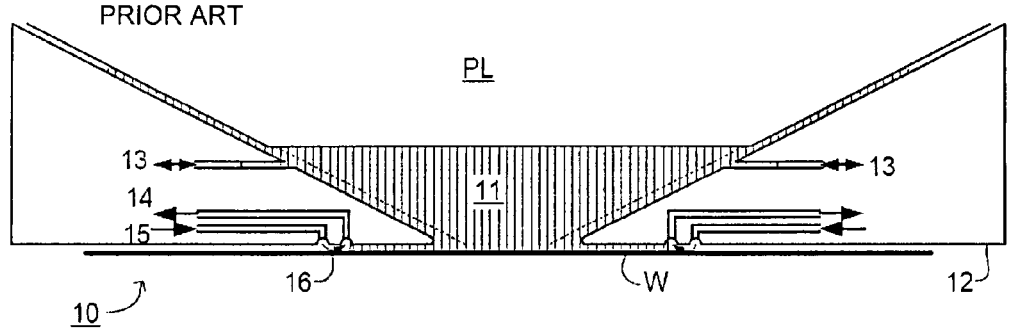
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). See, for example, U.S. patent application Ser. No. 10/844,575, hereby incorporated in its entirety by reference. A seal is typically formed between the liquid confinement structure and the surface of the substrate. In an embodiment, the seal is a contactless seal such as a gas seal.

FIG. 5 shows a liquid supply system (sometimes referred to as the immersion hood or showerhead) according to an embodiment of the invention used to supply liquid to the space between the final element of the projection system and the substrate. Reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid.

Figure 6:
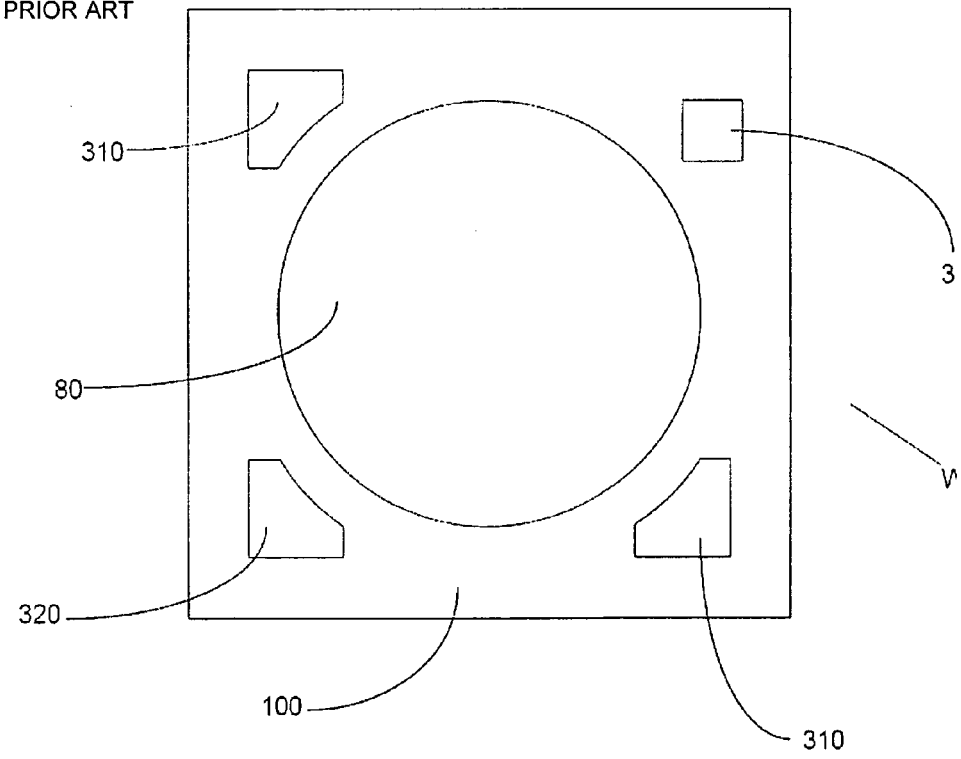
FIG. 6 depicts, in plan, a substrate table from above.
Figure 7:
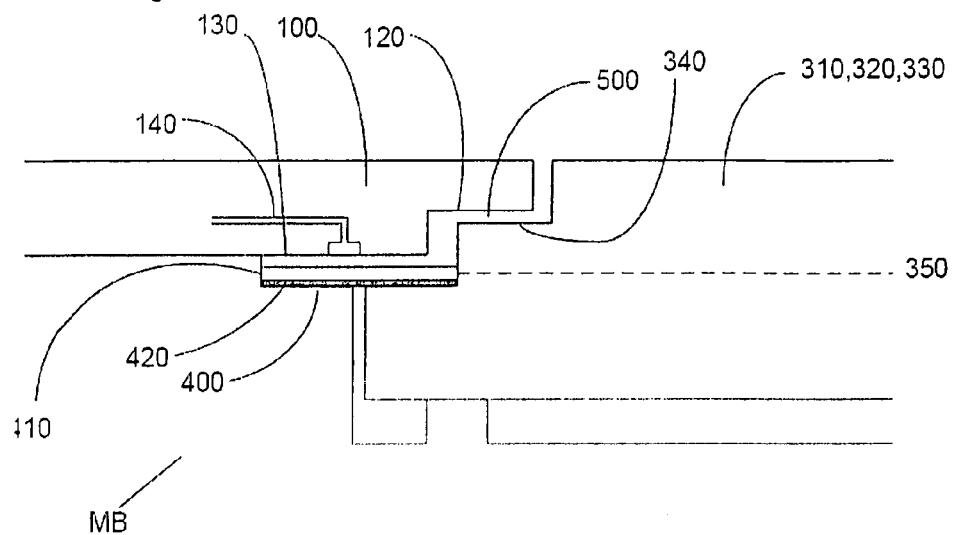
FIG. 7 illustrates, in cross-section, a seal formed between a block of the substrate table and a sensor of the substrate table of FIG. 6.

FIGS. 6 and 7 illustrate a substrate table WT. The substrate table WT comprises a block MB which, in an embodiment, holds or has one or more mirrors for one or more interferometers used to measure and/or calculate the position of the substrate W. In an embodiment, the block MB also houses one or more actuators to position the substrate W. The substrate W is held by a substrate support which is positioned on a top surface of the block MB. In an embodiment, the substrate support is a so called pimple or burl table, which comprises a plurality of projections on upper and/or lower surfaces.

Because the substrate table WT is to be used in an immersion lithography apparatus in which liquid (e.g. water) is placed between the projection system and the substrate, the substrate table further comprises a cover plate 100 at a top surface of the block MB. The cover plate 100 provides a substantially flat and continuous upper surface so that a liquid supply system of the localized area type (i.e. one which provides liquid to only a localized area of the substrate W at one time) can be used. Thus, the top surface of the cover plate 100 is substantially co-planar with the top surface of the substrate W (and also with the top surface of any sensor which might be positioned in a recess in the top surface of the block MB, as is shown in FIG. 7 and described below). In an embodiment, the cover plate 100 may be separate from the block MB (and positioned on top of a top surface of the block MB) or may be integral to the block MB.

In order to reduce or prevent ingress of liquid into a recess 80 between the substrate support and the block MB, a seal may extend between the inner edge of the cover plate 100 and the top surface of the substrate support. The arrangement is described in detail in U.S. patent application Ser. No. 11/006,550, filed 8 Dec. 2004 and hereby incorporated in its entirety by reference. In an embodiment, the substrate support may be removed from the block MB without major dismantling of the substrate table WT. In an embodiment, the cover plate 100 is removably mounted on the top surface of the block MB so that elements of the substrate table WT protected by the cover plate 100 may easily be serviced.

FIG. 6 is a schematic view in plan of the top surface of the substrate table WT. In fact what can be seen is the top surface of the cover plate 100 with various orifices. The central circular orifice is the orifice for a recess 80 in which a substrate support configured to support the substrate, is positioned. One or more other components are positioned around the central orifice and are capable of being illuminated by the beam B of the projection system PS. These one or more various components may be sensors, including, in an embodiment, two transmission image sensors (TIS) 310, a spot sensor 330 and an integrated lens interferometer at scanner (IL-IAS) 320. As discussed, in an embodiment, the cover plate 100 may be easily removed from the block MB but it may also be necessary for there to be a good seal between the cover plate 100, one or more of the sensors 310, 320, 330 and the block MB.

The arrangement shown in FIG. 7 is a schematic cross-section through the edge of the cover plate 100 of a sensor 310, 320, 330 and the block MB. Ideally a good seal between the cover plate 100 and the sensor 310, 320, 330 could be established, though not at the expense of serviceability (i.e., removability of the cover plate). Also, disturbances between the cover plate 100, the block MB and the sensor 310, 320, 330 should be reduced or minimized. For this reason, a two part seal construction is provided in which the bottom layer functions as a fully liquid tight seal and the upper layer is built as a constriction with the ability to remove any liquid (and any enclosed gas bubbles) which does enter the constriction.

The bottom layer of the seal described in U.S. patent application Ser. No. 11/006,550, filed 8 Dec. 2004, is positioned between the sensor 310, 320, 330 and the block MB, which are typically abutting or separated by up to about 5 mm or more. Steps are machined out of both the block MB and the sensor 310, 320, 330 for the seal structure 400 to lie on. The seal structure 400 is adhered at each of its ends with a bead of adhesive to the block MB and the sensor 310, 320, 330. The adhesive is only applied at the ends of the seal structure so that the seal structure can undergo a small pivoting movement at each of its ends. Thus, the seal structure 400 is manufactured so that it is narrower than the gap between the walls of the block MB and the sensor 310, 320, 330 to which it is adhered. This bottom layer of the seal is fully liquid tight. In this way, the seal structure is compliant in the Z direction and allows the sensor 310, 320, 330 to move in the Z direction independent of the block MB or the cover plate 100.

The seal structure 400 may be difficult to position and the provision of a bead of glue around the entire periphery of the sensor 310, 320, 330 and the recess of the block MB may be difficult. Indeed, with such a system, replacing of a sensor 310, 320, 330 may need to be carried out at the apparatus supplier rather than on site by the end user. Accordingly, in an embodiment, a disposable seal structure 400 is provided which comprises a first (sealing) part 410 and a second (adhesive) layer 420.

Figure 8:
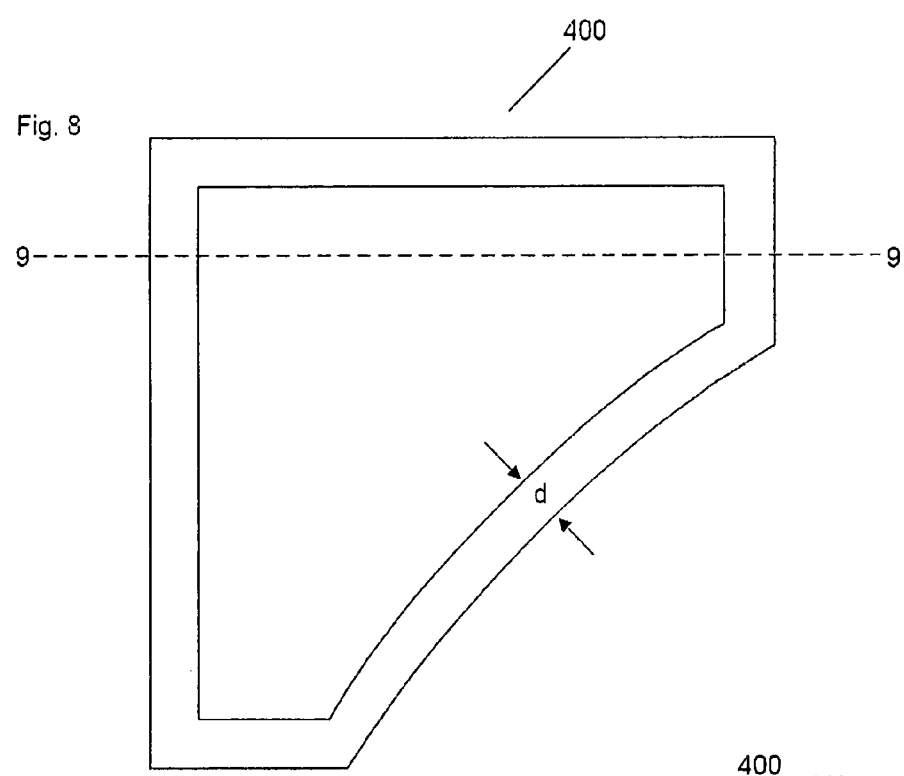
FIG. 8 depicts, in plan, a seal structure according to an embodiment of the present invention.
Figure 9:
FIG. 9 depicts, through line 9-9 in cross-section, the seal structure of FIG. 8.

A disposable seal structure 400 according to an embodiment the present invention is schematically illustrated in plan in FIG. 8 and in cross-section in FIG. 9. As can be seen, the seal structure 400 is made as a closed loop which has substantially the same shape as a sensor 310, 320, 330 which is to be sealed to the block MB of the substrate table WT. Typically the width of the seal structure d would be of the order of 1 cm though a range of from 0.2 mm to 50 mm is possible. The disposable seal structure is made of a liquid proof material (if the immersion liquid is water, water proof material) which resists the penetration of the liquid and is not dissolved by the liquid. In an embodiment, materials of which the disposable seal structure 400 is made are low cost as it is envisaged that the seal is replaced each time the sensor 310, 320, 330 is replaced. The seal structure 400 is relatively flexible to ensure low force coupling between the sensor 310, 320, 330 and the block MB. Suitable materials of the first part 410 of the seal structure 400, which is liquid proof and provides the majority of the strength of the seal structure, may include metal, rubber, polyethylene (PE), polyvinyl chloride (PVC), high density polyethylene (HDPE), elastomer, or fluoroelastomer (such as Viton™ fluoroelastomer available from DuPont Dow). In an embodiment, the seal structure 400 comprises a metal coated in a soft plastics material foil, like polyester or PVC. The thickness of the first part 410 is of the order of 5 μm to 2 mm, in an embodiment 5 to 50 μm A layer of adhesive 420 is provided on one side of the first part 410 of the seal structure 400. The layer of adhesive is of a material suitable for adhering to both the material of the first part of the seal structure as well as the material of the block MB and the sensor 310, 320, 330. A typical adhesive would be a material selected from the group of acrylate based materials, MS polymer, polyurethane or silicone. The adhesive is also flexible and has a high elasticity as well as being compatible with the liquid. A typical thickness of the adhesive layer is 25 μm—in an embodiment, in the range of from 1 μm to 0.5 mm. Although it is illustrated that the adhesive layer is provided along all of one side of the first part, this is not necessarily the case and the adhesive could be provided only at or near to the ends of the seal structure 400 at the positions at which the seal structure needs to be adhered to on the inner side to the sensor 310, 320, 330 and on the outer side to the block MB.

In an embodiment, the seal structure 400 is provided with a backing sheet 430 which is removably adhered to the adhesive layer 420 on the side of the adhesive layer 420 opposite the first part 410. This considerably aids in handling of a seal structure 400 prior to sealing the gap between the sensor 310, 320, 330 and the block MB Therefore, to replace a sensor 310, 320, 330 in the block MB, first the coverplate 100 may be removed from the block MB and then the existing seal structure 400 which seals between the block MB and the existing sensor 310, 320, 330 is broken so that the sensor 310, 320, 330 can be removed or the seal is broken during removal of the sensor 310, 320, 330. Either action typically would leave debris of the seal structure 400 behind on the block MB either just adhesive 420 or adhesive 420 and first part 410. This is cleaned from the block MB using, for instance, acetone. The seal may be broken prior to removal of the sensor 310, 320, 330 in any way. One method is to cut the seal structure 400 in the gap between the sensor 310, 320, 330 and the block MB by inserting a blade or similar object through the seal structure 400 between the sensor 310, 320, 330 and the block MB. For this purpose, the seal structure 400 needs to be constructed such that it is not too difficult to break the seal structure using reasonable force or an instrument such as a blade. The seal structure 400 may then be disposed of and is therefore made of low cost material A new sensor (or the same sensor after refurbishment or repair) may then be placed in the space left open by the removal of the sensor. A new seal structure 400 can be provided and the backing sheet 430 removed and the seal structure applied between the sensor 310, 320, 330 and the block MB. Alternatively, the seal structure 400 can be applied around the outside of the sensor 310, 320, 330 before the insertion of that sensor into the recess in the block MB. Then when the sensor is positioned in the block MB, the radially outer end of the seal structure 400 can then be pressed down onto the step formed in the block MB to seal between the block MB and the sensor 310, 320, 330.

In an embodiment, in order to protect the seal from illumination by the beam B and therefore possible degradation, a projection 120 is manufactured around the inner periphery of the cover plate 100. This projection, in the form of a step 120, interacts with a complimentary step 340 machined in the sensor 310, 320, 330. A gap 500 between the projection 120 of the cover plate 100 and the step 340 of the sensor 310, 320, 330 is provided so that disturbance forces are not transmitted between the sensor 310, 320, 330 to the cover plate 100 but the size of the gap 500 should be made small (in an embodiment, less than 0.3 mm, less than 0.1 mm or less than 0.05 mm) to provide a constriction through which liquid cannot easily pass. This is similar to the edge seal structure described in U.S. patent application Ser. No. 11/006,550, filed 8 Dec. 2004. One or more of the sensors 310, 320, 330 may be illuminated by the beam B through the liquid. Any liquid which does pass through the constriction 500 is extracted by a low pressure inlet 140 positioned above the seal structure 400. The low pressure inlet 140 or an additional low pressure inlet may be positioned under or at one side of the seal structure 400 The complimentary interlocking steps of the cover plate 100 and the sensor 310, 320, 330 are such that a path from the top of the substrate table to the seal structure is tortuous.

Although two types of seal have been discussed in relation to sealing between the cover plate 100 and the substrate support and the block MB and a sensor 310, 320, 330, these are exemplary examples only and the seals may be used to seal between any two parts of the substrate table, between the substrate table and the substrate W itself, or between any two parts in a lithographic apparatus that may be exposed to liquid.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table. In a preferred embodiment, the apparatus, method and/or computer program product as described herein is applied to a single stage/table lithography apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a substrate table constructed to hold a substrate and having a removable sensor, the substrate table having a recess in the substrate table extending below the top surface of the substrate table; and
   a disposable seal structure positioned between the sensor and the substrate table, the seal structure being adhered at one end to the sensor and at another end to the substrate table, the seal structure configured to seal a periphery of the sensor to the substrate table, and the seal structure defining an aperture having a shape corresponding substantially to the periphery of the sensor, being flexible, having an adhesive layer applied to one side, being liquid proof, dimensioned to fit the recess, and having a thickness of about 5 µm to about 50 µm.

2. The apparatus of claim 1, wherein the layer of adhesive comprises an acrylate based material, MS polymer, polyurethane or silicone.

3. The apparatus of claim 1, wherein the flexible seal structure surrounds the sensor.

4. The apparatus of claim 1, wherein the flexible seal structure comprises metal, rubber, PE, PVC, HDPE, a fluoroelastomer or a combination of any of the foregoing.

5. The apparatus of claim 1, wherein the flexible seal structure comprises a metal coated in a plastic material.

6. The apparatus of claim 1, wherein an edge of the sensor and an edge of the substrate table have complimentary interlocking steps arranged above the seal structure such that a path from the top of the substrate table to the seal structure is tortuous.

7. The apparatus of claim 6, further comprising a cover plate configured to cover a portion of a top surface of the substrate table, wherein the edge of the substrate table is an edge of an orifice in the cover plate.

8. The apparatus of claim 6, wherein the seal structure lies on one of the steps of the sensor.

9. A device manufacturing method, comprising:
   projecting a beam of radiation onto a removable sensor, wherein a disposable seal structure is positioned between the sensor and a substrate table configured to hold a substrate in a lithographic projection apparatus, the seal structure being adhered at one end to the sensor and at another end to the substrate table, the seal structure configured to seal a periphery of the sensor to the substrate table, the seal structure defining an aperture having a shape corresponding substantially to the periphery of the sensor, being flexible, having an adhesive layer applied to one side, being liquid proof, dimensioned to fit a recess in the substrate table extending below the top surface of the substrate table, and having a thickness of about 5 µm to about 50 µm.

10. A disposable seal structure configured to seal a periphery of a removable sensor to a substrate table in a lithographic projection apparatus, the seal structure defining an aperture having a shape corresponding substantially to the periphery of the sensor, being flexible, having an adhesive layer applied to one side, being liquid proof, dimensioned to fit a recess in the substrate table extending below the top surface of the substrate table, and having a thickness of about 5 µm to about 50 µm.

11. The seal structure of claim 10, wherein the seal structure is formed in a closed loop.

12. The seal structure of claim 10, further comprising a backing sheet removably adhered to the adhesive layer on a side of the adhesive layer opposite the seal structure.

13. The seal structure of claim 10, wherein the layer of adhesive comprises an acrylate based material, MS polymer, polyurethane or silicone.

14. The seal structure of claim 10, wherein the seal structure comprises metal, rubber, PE, PVC, HDPE, a fluoroelastomer, or a combination of any of the foregoing.

15. The seal structure of claim 14, wherein the seal structure comprises a metal coated in a plastic material.

16. The seal structure of claim 10, wherein a portion of the seal structure to seal between the sensor and the substrate table has a width selected from within the range of approximately 0.2 millimeters to 50 millimeters.

17. The seal structure of claim 16, wherein the width is approximately 5 millimeters.

18. The seal structure of claim 10, wherein the seal structure comprises a first side having a non-adhesive sealing layer and a second side having an adhesive layer, the adhesive layer of the seal structure arranged to adhere to both the substrate table and the sensor.

19. A combination of a removable sensor and a disposable seal structure configured to seal a periphery of the sensor to a substrate table in a lithographic projection apparatus, the seal structure defining an aperture having a shape corresponding substantially to the periphery of the sensor, being flexible, having an adhesive layer applied to one side, being liquid proof, dimensioned to fit a recess in the substrate table extending below the top surface of the substrate table, and having a thickness of about 5 µm to about 50 µm.

20. A method of sealing between a removable sensor of a substrate table in a lithographic projection apparatus and the substrate table, comprising:
   adhering a disposable seal structure configured to seal a periphery of the sensor to the substrate table, the seal structure defining an aperture having a shape corresponding substantially to the periphery of the sensor, being flexible, having an adhesive layer applied to one side, being liquid proof, dimensioned to fit a recess in the substrate table extending below the top surface of the substrate table, and having a thickness of about 5 µm to about 50 µm, at one end to the sensor and at another end to the substrate table with the adhesive layer.

21. A disposable seal structure configured to seal a periphery of a removable sensor to a substrate table in a lithographic projection apparatus, the seal structure defining an aperture having a shape corresponding substantially to the periphery of the sensor, being flexible, having an adhesive layer applied to one side, dimensioned to fit a recess in the substrate table extending below the top surface of the substrate table, having a thickness of about 5 µm to about 50 µm, and having a material that does not dissolve into immersion liquid that comes into contact with the material and resists penetration of the immersion liquid.

* * * * *